(12) United States Patent
Gambin et al.

(10) Patent No.: US 8,575,657 B2
(45) Date of Patent: Nov. 5, 2013

(54) DIRECT GROWTH OF DIAMOND IN BACKSIDE VIAS FOR GAN HEMT DEVICES

(75) Inventors: Vincent Gambin, Gardena, CA (US);
Rajinder Sandhu, Castaic, CA (US);
Benjamin Poust, Hawthorne, CA (US);
Michael Wojtowicz, Long Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 13/425,245

(22) Filed: Mar. 20, 2012

(65) Prior Publication Data
US 2013/0248879 A1 Sep. 26, 2013

(51) Int. Cl.
H01L 23/10 (2006.01)
H01L 23/34 (2006.01)
H01L 29/66 (2006.01)

(52) U.S. Cl.
USPC ............ 257/194; 257/705; 257/706; 257/707

(58) Field of Classification Search
USPC .......................................... 257/194, 705–707
See application file for complete search history.

(56) References Cited

U.S. PATENT DOCUMENTS

| | | | |
|---|---|---|---|
| 6,497,763 B2 * | 12/2002 | Kub et al. | 117/94 |
| 6,987,318 B2 * | 1/2006 | Sung | 257/720 |
| 7,745,848 B1 | 6/2010 | Rajagopal | |
| 7,892,881 B2 | 2/2011 | Chen | |
| 8,039,301 B2 | 10/2011 | Kub | |
| 2002/0117695 A1 * | 8/2002 | Borges et al. | 257/279 |
| 2005/0067716 A1 * | 3/2005 | Mishra et al. | 257/778 |
| 2006/0017064 A1 | 1/2006 | Saxler | |
| 2007/0054467 A1 | 3/2007 | Currie | |
| 2007/0228873 A1 | 10/2007 | Lin | |
| 2010/0032717 A1 | 2/2010 | Palacios | |
| 2010/0072485 A1 | 3/2010 | Suda | |
| 2010/0084688 A1 | 4/2010 | Lu | |
| 2010/0295100 A1 | 11/2010 | Huang | |
| 2011/0005942 A1 | 1/2011 | Kohn | |
| 2011/0024767 A1 | 2/2011 | Sung | |
| 2011/0057235 A1 * | 3/2011 | Shim | 257/194 |
| 2011/0064105 A1 | 3/2011 | Saxler | |
| 2011/0220948 A1 | 9/2011 | Yoo | |
| 2011/0220978 A1 | 9/2011 | Ikeda | |
| 2011/0241018 A1 | 10/2011 | Korenstein | |

FOREIGN PATENT DOCUMENTS

FR 2 713 827 6/1995
JP 11-026383 A 1/1999

OTHER PUBLICATIONS

Faili, F. N. "GaN-on-Diamond substrates for HEMT applications" Diamond Tooling Journal, 1-09, pp. 52-55.

* cited by examiner

*Primary Examiner* — Matthew W Such
*Assistant Examiner* — Robert Carpenter
(74) *Attorney, Agent, or Firm* — John A. Miller; Miller IP Group, PLC

(57) ABSTRACT

A GaN high electron mobility transistor (HEMT) device having a silicon carbide substrate including a top surface and a bottom surface, where the substrate further includes a via formed through the bottom surface and into the substrate. The device includes a plurality of epitaxial layers provided on the top surface of the substrate, a plurality of device layers provided on the epitaxial layers, and a diamond layer provided within the via.

20 Claims, 2 Drawing Sheets

DIRECT GROWTH OF DIAMOND IN BACKSIDE VIAS FOR GAN HEMT DEVICES

BACKGROUND

1. Field of the Invention

This invention relates generally to a GaN semiconductor device and, more particularly, to a GaN high electron mobility transistor (HEMT) device fabricated on a silicon carbide (SiC) substrate, where the substrate includes a back-side via that includes diamond.

2. Discussion of the Related Art

Integrated circuits are typically fabricated by epitaxial fabrication processes that deposit or grow various semiconductor layers on a substrate to provide the circuit components for the device. Substrates for integrated circuits can include various materials, usually semiconductor materials, such as silicon, sapphire, SiC, InP, GaAs, etc. As integrated circuit fabrication techniques advance and become more complex, more circuit components are able to be fabricated on the substrate within the same area and be more closely spaced together. Further, these integrated circuit fabrication techniques allow the operating frequencies of the circuit to increase to very high frequencies, well into the GHz range.

HEMT devices are popular semiconductor devices that have many applications, especially high frequency and high power applications, for example, power amplifiers. GaN HEMT devices are typically epitaxial grown on a suitable substrate for these applications, where the substrate needs to be highly thermally conductive, electrically insulative, have a thermal expansion coefficient similar to GaN and provide lattice spacing matching for suitable epitaxial growth. Suitable materials that are both highly thermally conductive and electrically insulative are relatively unique.

A high thermally conductive substrate is necessary so that heat is removed from the device junction through the epitaxial layers and the substrate so that the device is able to operate at high power in a reliable manner. Particularly, as the temperature of the device increases above some threshold temperature, the electrical performance of the device is reduced, which reduces its high power capability. Further, too high of a temperature within the device reduces its reliability because its time to failure will be reduced. Also, these types of devices are typically high frequency devices, which become smaller in size as the frequency increases, which reduces their ability to withdraw heat. The conductive path for heat generated at the device junction layer in an HEMT device causes the heat to propagate through the epitaxial layers and the substrate and into the device packaging. Therefore, it necessary to provide a high thermally conductive substrate that does not impede the path of the heat exiting the device, and allows the heat to spread out over a larger area. The thickness of the substrate is optimized to provide a low resistance heat path into the packaging from the device and provide the ability to spread the heat out away from the device.

For GaN HEMT devices, silicon carbide (SiC) substrates are currently the industry standard for providing the desirable characteristics of electrically insulating, highly thermally conductive, a close lattice match to that of GaN and a similar thermal expansion coefficient to that of GaN. However, although SiC is a good thermal conductor, its thermal conductivity is still limited, and as the junction temperature rises in the device, the ability of the SiC substrate to remove the heat is limited, which limits the output power of GaN HEMT devices, and subsequently their reliability, as discussed above.

It is desirable to provide a suitable substrate for a GaN HEMT device that has a greater thermal conductivity than SiC. Diamond is electrically insulating and has the highest thermal conductivity of any bulk material. However, it is currently not possible to epitaxial grow GaN layers on large area single-crystal diamond substrates for many reasons, including availability, a large lattice spacing mismatch and different thermal expansion coefficients. Efforts have been made in the industry to overcome these problems so as to use diamond substrates in a semiconductor device, such as GaN HEMT devices. For example, it is known in the art to remove the SiC substrate, or other substrate, that the GaN layers can effectively be grown on, and then bond a diamond substrate to the device using a bonding layer. However, there is now a bonding layer of some thickness between the GaN device layers and the diamond substrate that does not have the proper thermal conductivity, and thus affects the ability of heat to be removed from the device through the diamond substrate. Further, because bulk diamond has a low thermal coefficient of expansion, there is still the problem that the difference between the thermal expansion coefficients of the device layers and the substrate causes wafer curvature and possibly epitaxial layer cracking.

It is also known in the art to grow diamond on the front-side of the device opposite to the substrate. However, it has been shown that these types of devices have limited improvement in thermal conductivity and heat flow out of the device because heat flow through the substrate is still highly important. Further, GaN layers may not survive the high temperature diamond deposition process, and thus may need to be protected using a thermally resistive layer, which again limits the thermal performance.

DETAILED DESCRIPTION OF THE EMBODIMENTS

The following discussion of the embodiments of the invention directed to a GaN HEMT device including a diamond filled via extending through a back-side of a substrate of the device is merely exemplary in nature, and is in no way intended to limit the invention or its applications or uses.

Figure 1:
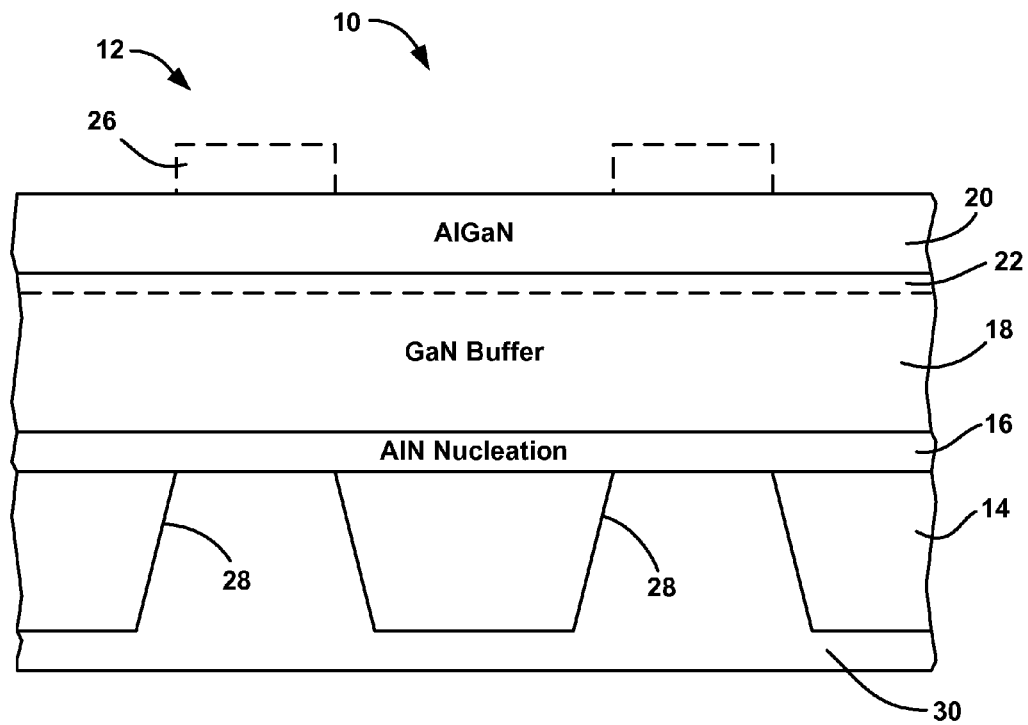
FIG. 1 is a cross-sectional profile view of a portion of a wafer including GaN HEMT devices each having a diamond via extending completely through a substrate of the wafer.

FIG. 1 is a partial cross-sectional profile view of a semiconductor wafer 10 including HEMT devices 12 fabricated on a substrate 14, where the various epitaxial and device layers of the HEMT devices 12 are deposited or grown using known epitaxial growth techniques. Although only two of the devices 12 are shown in FIG. 1, during the device fabrication process, many of the devices 12 are simultaneously fabricated on a single wafer in a manner that is well understood by those skilled in the art. The substrate 14 can be any substrate suitable for the purposes discussed herein, such as SiC, sapphire, GaN, AlN, silicon, etc. Once the device layers are grown and the devices 12 are further fabricated, certain processes are performed to separate the devices 12 on the wafer 10, where the devices 12 are later packaged.

For the particular non-limiting device design being discussed, an AlN nucleation layer 16 is grown on the substrate 14 to provide a base layer for proper epitaxial growth of the device profile layers. Next, a GaN buffer layer 18 is grown on the nucleation layer 16, and an AlGaN barrier layer 20 is grown on the buffer layer 18. Other layers may be deposited on the barrier layer 20. The piezoelectric/spontaneous polarization effect between the AlGaN barrier layer 20 and the GaN buffer layer 18 generates a 2-DEG layer 22. Layer 26 represents all other device layers that may be present on top of the 2-DEG layer 22, including the epitaxial contact layers, ohmic contacts, such as the drain and source terminals and the gate metal, etc. It is noted that this specific devices profile is a general representation for a GaN HEMT in that other HEMT device designs may have other layers.

Once the epitaxial layers for the devices 12 have been grown on the substrate 14, the front side of the epitaxial layers is protected with a thermally stable layer (not shown), such as silicon nitride (SiN) or other refractory materials. The wafer 10 is flipped over and the back-side of the substrate 14 is patterned using a suitable mask (not shown) to provide thermal vias 28 and alignment marks (not shown). Particularly, the back-side of the substrate 14 is selectively etched through the substrate 14 to stop at the AlN nucleation layer 16 to form the vias. A diamond seed layer is dispersed on the back-side of the wafer 10 and in the vias 28, and then a polycrystalline diamond is grown on the back-side of the wafer 10 to form a diamond layer 30 so that the vias 28 are filled with diamond. The back-side of the wafer 10 can then be polished to smooth the diamond layer 30 to make it more conforming to the device structure to provide a better thermal contact to the packaging.

Once the diamond layer 30 is grown on the back-side of the wafer 10 and contacts the AlN nucleation layer 16 through the via 28, the wafer 10 is again flipped over to fabricate the remaining device layers, namely the layers 26, on the front side of the wafer 10. Suitable patterning and metal deposition steps are then performed to deposit the source, drain and gate terminals on the 2-DEG layer 22. Suitable metallization lines and the like are formed to provide electrical connections, and those conducting layers that extend between the devices 12 on the wafer 10 are rendered insulative by suitable techniques, all well understood by those skilled in the art. Once the final fabrication steps are performed, the wafer 10 is diced such that the separate circuits or chips, possibly including many of the devices 12, are separated and can be packaged for use. Thus, each device 12 in the circuit or chip includes a diamond area in the substrate 14 directly below the device layers 26 to provide greater thermal conductivity during operation of the device 12.

Alternatively, it may be desirable to selectively seed only the areas in and around the vias 28 to reduce wafer curvature from mismatched thermal expansion coefficients. Also, the diamond can be deposited across the entire backside of the wafer 10, and then selectively removed from those areas that are outside of the vias 28.

As is known in the art, polycrystalline diamond can be grown in various ways so that the amount of impurities and the crystalline formation of the diamond during the growth process can have different qualities. The larger the polycrystalline structure of the diamond and the higher the purity level, the higher the thermal conductivity of the diamond. However, the higher the purity of the diamond, the longer the deposition process will take and the more costly it will be. Therefore, it may be desirable that when growing the diamond layer 30 on the backside of the substrate 14 the growth process produces a purer higher thermally conductive diamond material closest to the AlN layer 16, and then subsequently grow a lower quality diamond layer farther away from the AlN layer 16, which would reduce the deposition time to fill the vias 28. Alternately, it may be desirable to grade the diamond purity over time as the diamond layer is being deposited by first providing the higher thermally conductive pure diamond and then slowly reducing the quality of the diamond during the growth process over time.

Figure 2:
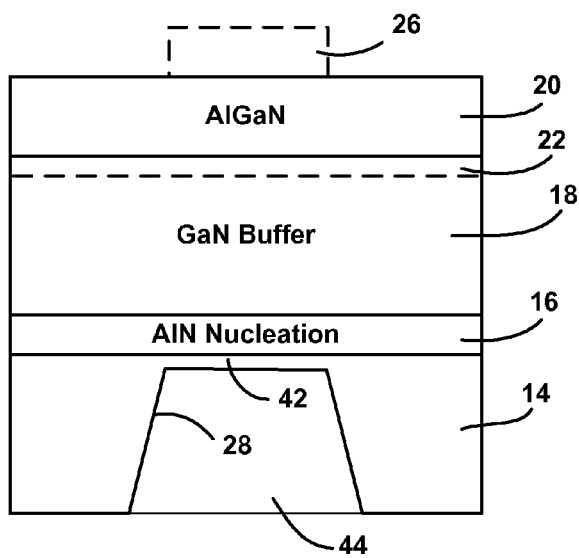
FIG. 2 is a cross-sectional profile view of a GaN HEMT device including a diamond via extending partially through a substrate of the device.

Alternately, the substrate 14 can be etched so that not all of the substrate material is removed in the via 28 where there would be a thin layer of the substrate material between the diamond layer 30 and the AlN layer 16 after the diamond is deposited in the via 28. FIG. 2 is a cross-sectional profile view of a partial structure for an HEMT device 40 similar to the device 12, where like elements are identified by the same reference numeral. In this embodiment, the substrate 14 is not completely etched to the AlN nucleation layer 16, but is stopped short of the layer 16 so that a thin layer 42 of the substrate material remains between the via 28 and the layer 16. Providing the thin layer 42 of the substrate material may have certain semiconductor properties for certain HEMT devices. Also, this embodiment shows diamond 44 only within the via 28.

Figure 3:
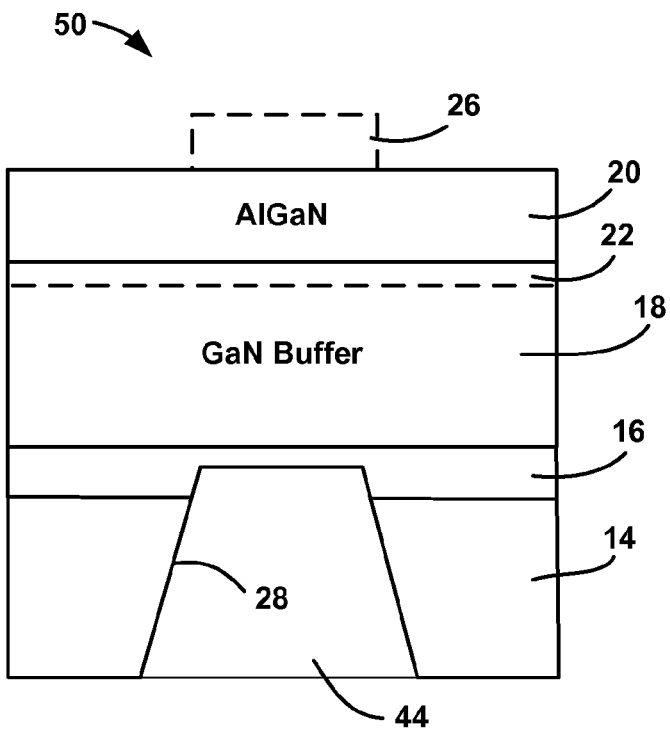
FIG. 3 is a cross-sectional profile view of a GaN HEMT device including a diamond via extending through a substrate and into one or more epitaxial layers of the device.

Further, it may be desirable to etch into the AlN nucleation layer 16 so that the diamond filled via 28 extends into the device epilayers. FIG. 3 is a cross-sectional profile view of a partial structure of an HEMT device 50 similar to the devices 12 and 40, where like elements and layers are identified by the same reference numeral. In this embodiment, the via 28 extends completely through the substrate 14 and into the AlN nucleation layer 16.

Figure 4:
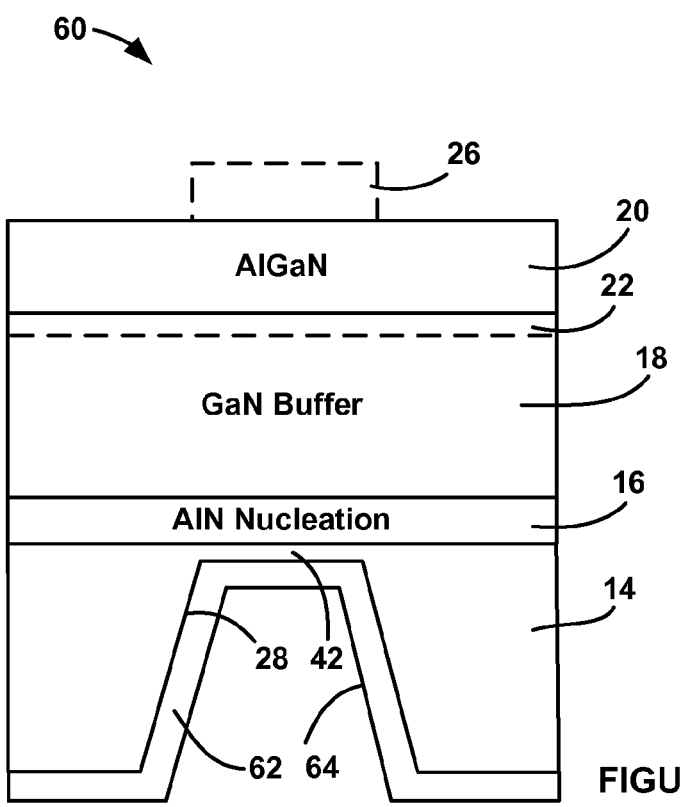
FIG. 4 is a cross-sectional profile view of a GaN HEMT device including a diamond layer formed in a via in a substrate of the device.

In an alternate embodiment, the via 28 may only be partially filled with the diamond layer 30 so that part of the via 28 remains open to air where that remaining portion may then be filled with a metal to provide a background plane in closer proximity to the epitaxial layers. FIG. 4 is a cross-sectional profile view of an HEMT device 60 similar to the HEMT devices 10 and 40, where the same device layers are identified by the same reference numeral. In this embodiment, a diamond layer 62 only partially fills the via 28 so that an open area 64 remains.

Although the devices discussed herein are HEMT devices, other types of devices, such as laser diodes or light emitting diodes, that employ GaN device layers deposited on a substrate may benefit from the higher performance provided by the thermally conductive diamond vias discussed herein. Further, although the embodiments discussed herein are specifically for SiC substrates, other suitable substrates, such as those referred to above, may also include formed vias filled with diamond for the same purpose.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A semiconductor device comprising:
   a substrate including a top surface and a bottom surface, said substrate further including a via formed through the bottom surface and into the substrate, wherein diamond is provided at least partially within the via in the substrate;

a plurality of GaN epitaxial layers grown directly on the top surface of the substrate; and a plurality of device layers grown on the epitaxial layers.

2. The device according to claim 1 wherein the diamond is provided only within the via.

3. The device according to claim 1 wherein the diamond is provided as a layer on the bottom surface of the substrate.

4. The device according to claim 1 wherein the diamond completely fills the via.

5. The device according to claim 1 wherein the diamond only partially fills the via.

6. The device according to claim 1 wherein the via extends completely through the substrate.

7. The device according to claim 1 wherein the via extends only partially through the substrate.

8. The device according to claim 1 wherein the device is a GaN high electron mobility transistor device and the substrate is a silicon carbide substrate.

9. The device according to claim 1 wherein the diamond is multiple diamond layers of different diamond purity where the highest purity diamond layers are closest to the top surface of the substrate.

10. The device according to claim 1 wherein the diamond is a graded diamond layer that is graded by diamond purity where the highest purity diamond is closest to the top surface of the substrate.

11. The device according to claim 1 wherein the via has a width about the same size as a width of the device layers.

12. The device according to claim 1 wherein the diamond is a polycrystalline diamond.

13. A GaN high electron mobility transistor (HEMT) device comprising:

a silicon carbide substrate including a top surface and a bottom surface, said substrate further including a via formed through the bottom surface and into the substrate;

a plurality of GaN epitaxial layers grown directly on the top surface of the substrate;

a plurality of device layers grown on the epitaxial layers; and a diamond layer provided within the via.

14. The device according to claim 13 wherein the via has a width about the same size as a width of the device layers.

15. The device according to claim 13 wherein the diamond layer is a polycrystalline diamond layer.

16. The device according to claim 13 wherein the diamond layer is provided only within the via.

17. The device according to claim 13 wherein the diamond layer is provided as a layer on the bottom surface of the substrate.

18. The device according to claim 13 wherein the diamond layer completely fills the via.

19. The device according to claim 13 wherein the diamond layer only partially fills the via.

20. A semiconductor device comprising:

a substrate including a top surface and a bottom surface, said substrate further including a via formed through the bottom surface and into the substrate, wherein diamond is provided within the via in the substrate;

a plurality of GaN epitaxial layers grown directly on the top surface of the substrate, wherein the via extends completely through the substrate and into at least one of the epitaxial layers; and a plurality of device layers grown on the epitaxial layers.

* * * * *